United States Patent [19]

Seki et al.

[11] Patent Number: 4,543,539

[45] Date of Patent: Sep. 24, 1985

[54] AMPLIFIER

[75] Inventors: Kunio Seki, Tokyo; Ritsuji Takeshita, Takasaki, both of Japan

[73] Assignee: Hitachi, Ltd., Tokyo, Japan

[21] Appl. No.: 523,970

[22] Filed: Aug. 17, 1983

[30] Foreign Application Priority Data

Sep. 24, 1982 [JP] Japan ................................. 57-164836

[51] Int. Cl.[4] .............................................. H03F 3/04
[52] U.S. Cl. ................................. 330/297; 330/207 P
[58] Field of Search ..................... 330/297, 207 P, 285, 330/298

[56] References Cited

U.S. PATENT DOCUMENTS 4,320,350 3/1982 Drapac ................................. 330/297

Primary Examiner—James B. Mullins
Assistant Examiner—G. Wan
Attorney, Agent, or Firm—Antonelli, Terry & Wands

[57] ABSTRACT

An amplifier comprises an amplifier circuit for amplifying an input signal and a supply voltage detector for controlling the operation of the amplifier circuit. The supply voltage detector has hysteresis characteristics as to a first threshold voltage and a second threshold voltage which are different from each other in order to detect the magnitudes of the supply voltage. The amplifying operation of the amplifier circuit is controlled as to the start-up and turn-off operation thereof by an output signal of the supply voltage detector.

14 Claims, 7 Drawing Figures

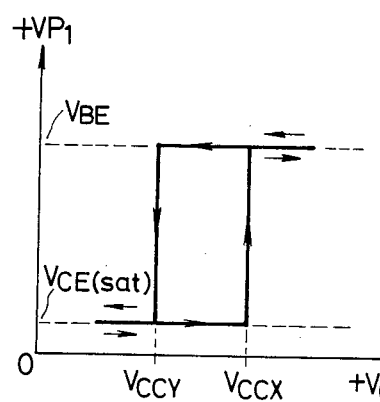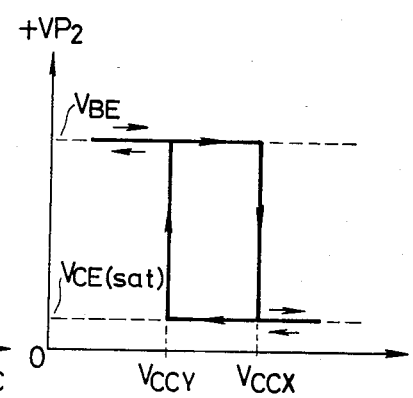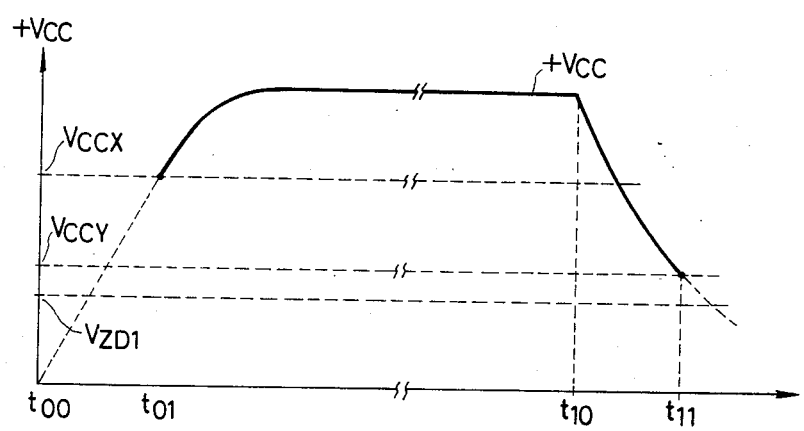

AMPLIFIER

BACKGROUND OF THE INVENTION

The present invention relates in general to amplifiers, and, in particular, to improvements in the start-up characteristics of amplifiers, such as audio amplifiers.

Amplifiers exhibit various operating difficulties during certain conditions and at various stages in the operation thereof. In this regard, when the supply voltage is first applied to the amplifier and prior to the time the supply voltage stabilizes, various undesirable operating phenomenon may occur, such as oscillation, resulting in noise being generated in the output of the amplifier. Drastic fluctuation in the supply voltage at the time of first application of power to the amplifier, i.e., at start-up of the circuit, also is capable of producing such undesirable operating conditions.

It has also been found by the inventors that various circuit elements of the amplifier can contribute to the undesirable phenomenon at start-up. In particular, smoothing circuits are subject to unwanted resonant operation in response to ripple or noise components in the supply voltage.

SUMMARY OF THE INVENTION

It is therefore an object of the present invention to provide an amplifir which can stably operate during a transient period before the power source voltage is stabilized upon energization of the amplifier at start-up.

In accordance with the present invention, an amplifier includes an amplifier circuit for amplifying an input signal and a supply voltage detector having a hysteresis characteristic for detecting first and second different theshold levels of the supply voltage and for controlling the amplifier circuit operation in response thereto during start-up and shut-off of the amplifier.

BRIEF DESCRIPTION OF THE DRAWINGS

FIGS. 3 and 4 are characteristic diagrams illustrative of the voltage variations of respective circuit nodes $P_1$ and $P_2$ in the circuit of FIG. 2 corresponding to the rise and fall of a power source voltage;

FIG. 5 is a waveform diagram illustrative of the rise and fall of a supply voltage with on and off operation of the amplifier;

DESCRIPTION OF THE PREFERRED EMBODIMENTS

Figure 1:
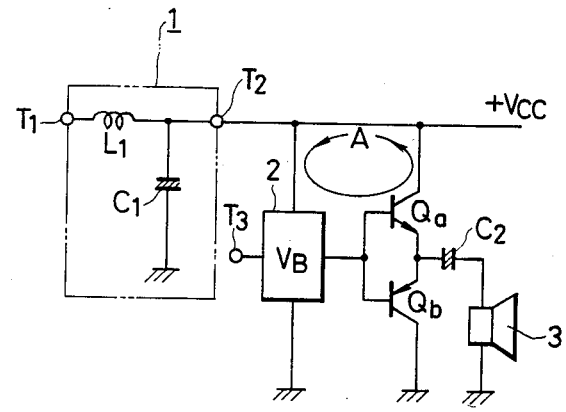
FIG. 1 is a circuit diagram of an amplifier which was studied by the inventors prior to the present invention.

Prior to description of the present invention, a description will be presented of the amplifier shown in FIG. 1, which was considered by the inventors prior to the present invention, so as to make more clear the type of problem to be solved by the present invention.

FIG. 1 is a circuit diagram which schematically illustrates the amplifier. The terminal $T_1$ of a smoothing circuit 1 is to be supplied with a power source voltage from a rectifier circuit (not shown) or a car battery. This power source voltage is smoothed by a smoothing circuit 1, formed by a coil $L_1$ and a capacitor $C_1$, and the smoothed voltage is fed as a supply voltage $+V_{CC}$ from a terminal $T_2$ to an amplifier circuit. A bias circuit 2 supplies a bias voltage $V_B$ to output transistors $Q_a$ and $Q_b$ of the amplifier circuit.

When an input signal fed to an input terminal $T_3$ is positive-going, the output transistor $Q_a$ is driven into its "on" state, and an output current flows from the $+V_{CC}$ power supply to a speaker 3 via this transistor $Q_a$ as well as a capacitor $C_2$. On the other hand, when the input signal of the input terminal $T_3$ is negative-going, the output transistor $Q_b$ is driven into its "on" state, and the discharge current of the capacitor $C_2$ flows to the speaker 3 via this output transistor $Q_b$ and ground.

The inventor's study has revealed that, when the supply voltage $+V_{CC}$ rises gradually upon first application of the power source to the amplifier circuit, or when the power source voltage has fluctuated drastically, the operation of the circuit becomes unstable, giving rise to a phenomenon as described below.

First, regarding the time of the first application of the power source before the $+V_{CC}$ power supply reaches the rated voltage level, the amplifier circuit comes into an oscillating condition at a certain voltage level, and noise develops. Further, when the power source voltage has drastically fluctuated to sharply lower the supply voltage $+V_{CC}$, the amplifier circuit comes into an oscillating condition and fails to perform the normal amplifying operation for which it is designed, and noise develops, as stated above.

The inventors have studied this phenomenon in detail. As a result, it has been revealed that, in the case of using a commercial power source, or even in the case of using a car battery as the power source, the phenomenon is liable to occur particularly when the smoothing circuit 1 has an inductance component. When the power source voltage contains a ripple component or a noise component, the coil $L_1$ and the capacitor $C_1$ come into a parallel resonant condition, and the impedance of the smoothing circuit 1 becomes high. Then, a positive feedback loop, as indicated by arrow A, is formed between the output transistor $Q_a$ and the bias circuit 2. In the amplifier circuit, accordingly, a kind of blocking oscillating operation occurs, due to which the phenomena described above takes place.

Figure 2:
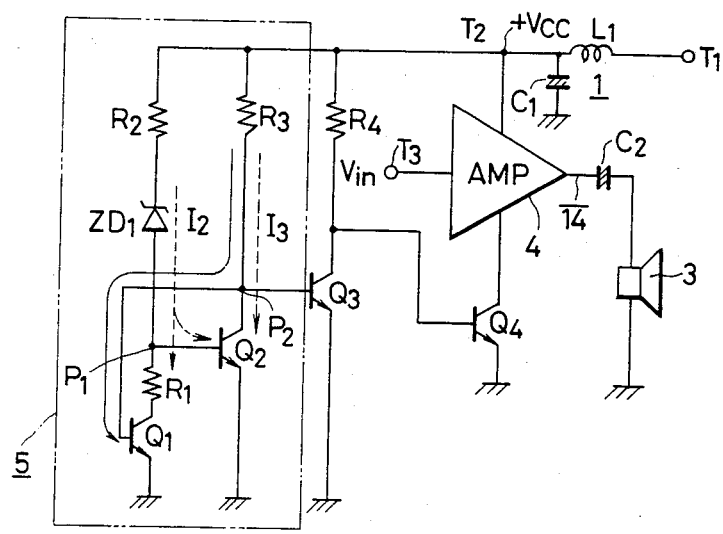
FIG. 2 is a circuit diagram of an amplifier embodying the present invention.

Referring now to the embodiments of the present invention, FIG. 2 shows a circuit diagram of an amplifier according to one embodiment of the present invention. A terminal $T_1$ is connected to a power source (not shown), such as a car battery, and is also connected to a smoothing circuit 1, which consists of a coil $L_1$ and a capacitor $C_1$.

Thus, a smoothed supply voltage $+V_{CC}$ is derived from the output terminal $T_2$ of the smoothing circuit 1. This supply voltage $+V_{CC}$ is fed to an amplifier circuit 4 as the operating voltage thereof. The input terminal $T_3$ of the amplifier circuit 4 is supplied with an input signal voltage $V_{in}$. An output signal derived from the output terminal $T_4$ of the amplifier circuit 4 is fed to a speaker load 3 through an output coupling capacitor $C_2$.

According to the present invention, a supply voltage detector 5 is especially provided in this amplifier. This supply voltage detector 5 possesses a hysteresis characteristic in its detecting operation. The amplifying operation of the amplifier circuit 4 is controlled into the operating condition or non-operating condition thereof by the output signal of the supply voltage detector 5.

In the embodiment of FIG. 2, the supply voltage detector 5 is constructed of transistors $Q_1$, $Q_2$, a Zener diode $ZD_1$ and resistors $R_1$, $R_2$ and $R_3$, as shown in the figure. Further, the output signal of the supply voltage detector 5 controls the operation of the amplifier circuit 4 through other control transistors $Q_3$ and $Q_4$.

Now, as shown in FIG. 5, when the power source is connected to the terminal $T_1$ at a time $t_{00}$, the supply voltage $+V_{CC}$ of the output terminal $T_2$ rises gradually. In the period in which this supply voltage $+V_{CC}$ is lower than the Zener voltage $V_{ZD1}$ of the Zener diode $ZD_1$, the current $I_2$ of a series path consisting of the resistor $R_2$ and the Zener diode $ZD_1$ is null, so that the transistor $Q_2$ is "off", and also the current $I_3$ of the collector-emitter path of this transistor is null. On the other hand, when the supply voltage $+V_{CC}$ has become greater than the base-emitter voltage $V_{BEQ1}$ of the transistor $Q_1$, current $I_1$ begins to flow through a series path consisting of the resistor $R_3$ and the base-emitter junction of the transistor $Q_1$. In contrast, the collector of the transistor $Q_1$ is not supplied with any current from the series path consisting of the resistor $R_2$ and the Zener diode $ZD_1$, so that this transistor $Q_1$ is driven into its saturation region. Thus, the collector-emitter voltage of the transistor $Q_1$ is held at a very small saturation voltage $V_{CE(sat)Q1}$. In this state, accordingly, the voltage $V_{P1}$ of a node $P_1$ becomes $V_{CE(sat)Q1}$, and the voltage $V_{P2}$ of a node $P_2$ becomes $V_{BEQ1}$.

When the supply voltage $+V_{CC}$ has become higher than the Zener voltage $V_{ZD1}$ of the Zener diode $ZD_1$, the current $I_2$ begins to flow through a series path consisting of the resistor $R_2$, Zener diode $ZD_1$ and resistor $R_1$. Accordingly, the potential of the node $P_1$ rises owing to a voltage drop $R_1 \cdot I_2$ across the resistor $R_1$. With the collector-emitter saturation voltage $V_{CE(sat)Q1}$ of the transistor $Q_1$ neglected because of being very small, the requirement under which the transistor $Q_2$ turns from the "off" state into the "on" state will be calculated below:

$$V_{CC} = R_2 \cdot I_2 + V_{ZD1} + V_{BEQ2} \tag{1}$$

$$R_1 \cdot I_2 > V_{BEQ2} \tag{2}$$

From equation (1), $$I_2 = \frac{V_{CC} - V_{ZD1} - V_{BEQ2}}{R_2} \tag{3}$$

Substituting equation (3) into inequality (2), $$\frac{R_1}{R_2}(V_{CC} - V_{ZD1} - V_{BEQ2}) > V_{BEQ2} \tag{4}$$

$$V_{CC} - V_{ZD1} - V_{BEQ2} > \frac{R_2}{R_1} V_{BEQ2}$$

$$V_{CC} > V_{CCX} = V_{ZD1} + \frac{R_1 + R_2}{R_1} \cdot V_{BEQ2}$$

Accordingly, when the supply voltage $+V_{CC}$ has become higher than $V_{CCX}$ as indicated in expression (4), the transistor $Q_2$ turns from the "off" state to the "on" state, and the transistor $Q_1$ turns from the "on" state into the "off" state. Accordingly, the voltage $V_{P2}$ of the node $P_2$ changes from $V_{BEQ1}$ to $V_{CE(sat)Q2}$, and the voltage $V_{P1}$ of the node $P_1$ changes from $V_{CE(sat)Q1}$ to $V_{BEQ2}$.

Further, as shown in FIG. 5, when the power source is disconnected from the terminal $T_1$ at a time $t_{10}$, the supply voltage $+V_{CC}$ of the output terminal $T_2$ lowers gradually. In the range in which the supply voltage $+V_{CC}$ is comparatively high to allow the current $I_2$ to flow through the Zener diode $ZD_1$, the transistor $Q_2$ is in the "on" state, and the transistor $Q_1$ is in the "off" state.

In addition, the requirement under which the lowering of the supply voltage $+V_{CC}$ results in turning the transistor $Q_2$ from the "on" state to the "off" state and turning the transistor $Q_1$ from the "off" state to the "on" state is as mentioned below:

$$V_{CC} < V_{CCY} = V_{ZD1} + V_{BEQ2} \tag{5}$$

Accordingly, when the supply voltage $+V_{CC}$ has become lower than $V_{CCY}$, as indicated in expression (5), the transistor $Q_2$ turns from the "on" state to the "off" state, and the transistor $Q_1$ is driven from the "off" state to the saturation region. Accordingly, the voltage $V_{P2}$ of the node $P_2$ changes from $V_{CE(sat)Q2}$ to $V_{BEQ1}$, and the voltage $V_{P1}$ of the node $P_1$ changes from $V_{BEQ2}$ to $V_{CE(sat)Q1}$.

The varying hysteresis charasteristics of the voltage $V_{P1}$ of the node $P_1$ and the voltage $V_{P2}$ of the node $P_2$, which correspond to the rise and fall of the supply voltage $+V_{CC}$, as described above, are respectively shown in FIG. 3 and FIG. 4.

Thus, after the power source has been connected to the terminal $T_1$ at the time $t_{00}$, the transistor $Q_2$ turns from the "off" state to the "on" state at a time $t_{01}$ at which $V_{CC} > V_{CCX}$ is established.

Accordingly, another control transistor $Q_3$ turns from the "on" state to the "off" state at that time. Then, the transistor $Q_4$ connected thereto turns from the "off" state on the "on" state, and it begins to permit supply of the bias voltage to the amplifier circuit 4. In this way, the amplifier circuit 4 starts the amplifying operation for the input signal voltage $V_{in}$ following the time $t_{01}$.

Meanwhile, after the power source has been disconnected from the terminal $T_1$ at the time $t_{10}$, the transistor $Q_2$ turns from the "on" state to the "off" state at a time $t_{11}$ at which $V_{CC} < V_{CCY}$ is established. Thus, the amplifier circuit 4 stops its amplifying operation for the input signal voltage $V_{in}$ following the time $t_{11}$.

Figure 6:
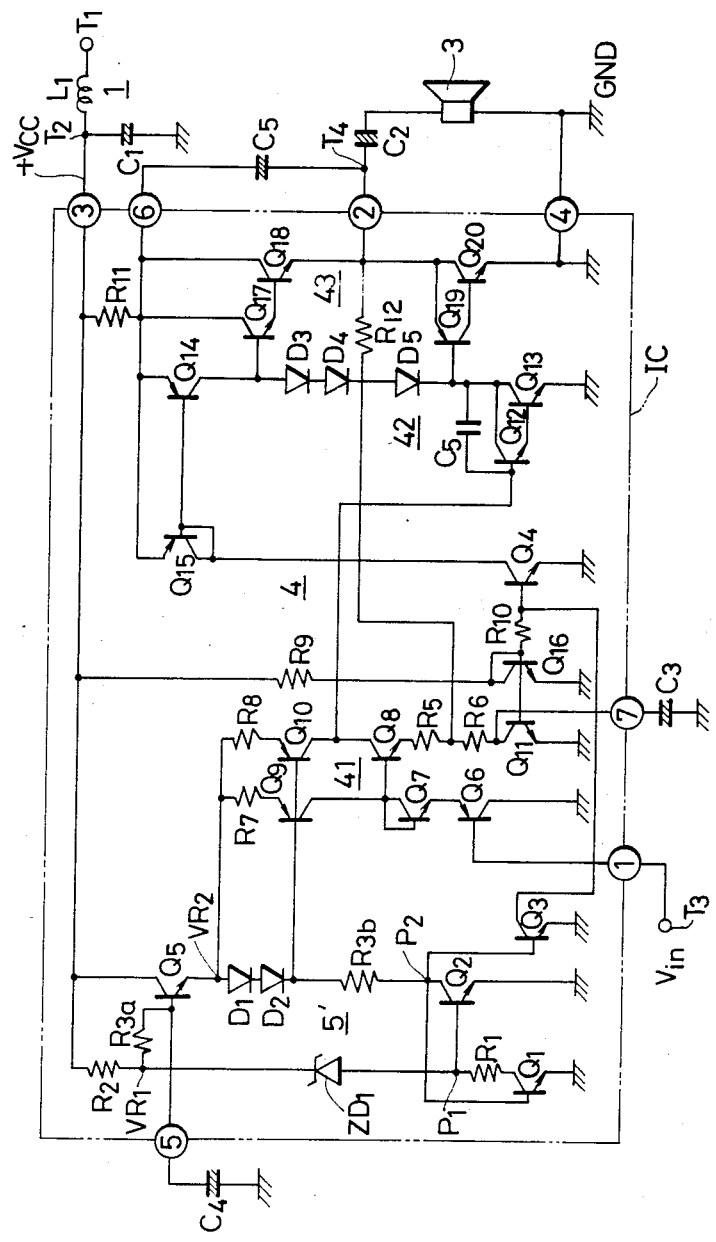
FIG. 6 is a circuit diagram of an amplifier circuit according to a more preferable embodiment of the present invention.

FIG. 6 shows a circuit diagram of an amplifier according to a more preferable embodiment of the present invention. Parts assigned the same symbols as in FIG. 2 will not be described in detail, and different points will be especially explained below.

Circuit components inside a broken line IC are formed within a monolithic semiconductor integrated circuit (hereinbelow, termed "IC"), and numerals enclosed with circles denote the terminal numbers of the IC.

The points of difference of a supply voltage detector 5' in FIG. 6 from the supply voltage detector 5 in FIG. 2 are that the resistor $R_3$ in FIG. 2 is replaced with a transistor $Q_5$, diodes $D_1$, $D_2$ and resistors $R_{3a}$, $R_{3b}$ in FIG. 6, and that the Zener voltage $V_{ZD1}$ of the Zener diode $ZD_1$ contributes also to stabilizing the direct current of the amplifier circuit 4.

In the steady state in which the supply voltage $+V_{CC}$ is sufficiently greater than the Zener voltage $V_{ZD1}$ of the Zener diode $ZD_1$, the following reference voltage $V_{R1}$ is generated at the common node between the resistor $R_2$ and the Zener diode $ZD_1$:

$$V_{R1} = V_{ZD1} + V_{BEQ2} \quad (6)$$

A capacitor $C_4$ and the resistor $R_{3a}$ which are connected to terminal No. 5 constitute a ripple filter. This ripple filter supplies the base of the emitter-follower transistor $Q_5$ with a D.C. voltage component in which a ripple component contained in the reference voltage $V_{R1}$ is attenuated. Accordingly, the following reference voltage $V_{R2}$ is derived from the emitter of the emitter-follower transistor $Q_5$:

$$V_{R2} = V_{R1} - V_{BEQ5} \div V_{ZD1} \quad (7)$$

Such reference voltage $V_{R2}$ is utilized as the stabilized operating voltage of the initial-stage amplifier circuit 41 of the amplifier circuit 4. The initial-stage amplifier circuit 41 is composed of transistor $Q_6$ through $Q_{11}$ and resistors $R_5$ through $R_8$. The input signal voltage $V_{in}$ of the input terminal $T_3$ is transmitted to the base of the initial-stage amplifying transistor $Q_8$ through terminal No. 1, the emitter-follower transistor $Q_6$ and the level shift diode-connected transistor $Q_7$.

Some fluctuation in the supply voltage $+V_{CC}$ results in some fluctuation of a direct current which flows through the collector-emitter path of the transistor $Q_5$ of the supply voltage detector 5′, the diodes $D_1$, $D_2$, the resistor $R_{3b}$, and the collector-emitter path of the transistor $Q_2$. However, since the forward voltages of the diodes $D_1$ and $D_2$ are scarcely changed even by such fluctuation of the direct current, currents to flow through the collector-emitter paths of the transistors $Q_9$ and $Q_{10}$ are substantially stabilized.

Accordingly, the transistor $Q_9$ supplies the stabilized biasing direct current to the diode-connected transistor $Q_7$ as well as the emitter-follower transistor $Q_6$, while the transistor $Q_{10}$ operates as a constant current load for the initial-stage amplifying transistor $Q_8$. An amplified signal derived from the collector of the initial-stage amplifying transistor $Q_8$ is fed to the Darlington-connected transistors $Q_{12}$ and $Q_{13}$ of a driving amplifier circuit 42. The Darlington-connected transistors $Q_{12}$ and $Q_{13}$ have a phase compensation capacitor $C_5$ connected thereto, and are also connected to diodes $D_3$, $D_4$ and $D_5$, which function as bias means for reducing crossover distortion. The collectors of the Darlington-connected transistors $Q_{12}$ and $Q_{13}$ are connected to a constant current load transistor $Q_{14}$ through the diodes $D_3$, $D_4$ and $D_5$.

A constant current to flow through is constant current load $Q_{14}$ is set by direct currents which flow through the collector-emitter paths of transistors $Q_{15}$ and $Q_4$. In turn, the direct current to flow through the collector-emitter path of the transistor $Q_4$ is set by a direct current which flows through a resistor $R_9$ and the collector-emitter path of a transistor $Q_{16}$.

Further, a direct current which flows through the resistor $R_6$ and the collector-emitter path of the transistor $Q_{11}$ in the initial-stage amplifier circuit 41 is set by a direct current which flows through the collector-emitter path of the transistor $Q_{16}$.

A push-pull output circuit 43, which is composed of transistors $Q_{17}$, $Q_{18}$, $Q_{19}$ and $Q_{20}$, is driven by the output signal of the driving amplifier circuit 42. Meanwhile, a negative feedback resistor $R_{12}$ is connected between terminal No. 2 (the output terminal of the amplifier circuit 4) and the common node of the resistors $R_5$ and $R_6$, and a negative feedback capacitor $C_3$ is connected to terminal No. 7. A bootstrap capacitor $C_5$, connected between terminals No. 2 and No. 6, raises the voltage of terminal No. 6 to be a higher level than the supply voltage $+V_{CC}$.

Figure 7:
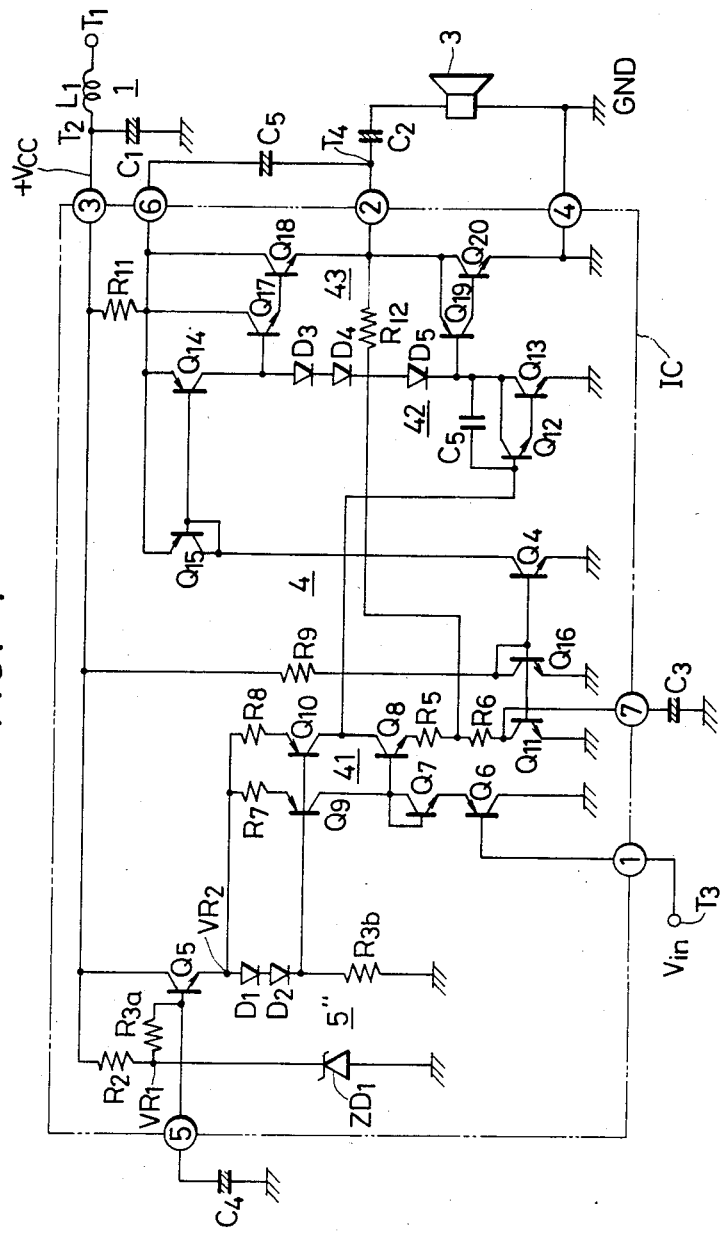
FIG. 7 shows a circuit diagram in the case where the present invention is not employed.

On the other hand, a circuit diagram of an amplifier, in which the present invention is not applied, is shown in FIG. 7, and the transistors $Q_1$, $Q_2$, $Q_3$ and resistors $R_1$, $R_{10}$ are not included. In the circuit of FIG. 7, a circuit 5″ which is composed of the Zener diode $ZD_1$, transistor $Q_5$, diodes $D_1$, $D_2$, resistors $R_2$, $R_{3a}$, $R_{3b}$ and capacitor $C_4$ operates as a mere bias circuit.

When the supply voltage $+V_{CC}$ has become smaller than the Zener voltage $V_{ZD1}$ of the Zener diode $ZD_1$ of the bias circuit 5″ in FIG. 7, this Zener diode $ZD_1$ is in the cut-off state, the fluctuation of the supply voltage $+V_{CC}$ appears in the reference voltage $V_{R2}$ substantially as it is. Accordingly, the forward voltages of the diodes $D_1$ and $D_2$ change greatly, and the direct currents of the transistors $Q_9$ and $Q_{10}$ of the initial-stage amplifier circuit 41 fluctuate greatly. Thus, an instability (noise, oscillation, etc.) in the amplifier circuit 4 arises.

When the supply voltage $+V_{CC}$ has become higher than the Zener voltage $V_{ZD1}$ of the Zener diode $ZD_1$ of the bias circuit 5″ in FIG. 7, this Zener diode $ZD_1$ turns "on". While the Zener diode $ZD_1$ is in the "on" state, the reference voltage $V_{R2}$ is hardly changed in spite of the fluctuation of the supply voltage $+V_{CC}$ and is maintained substantially constant by the Zener voltage $V_{ZD1}$. Accordingly, the forward voltages of the diodes $D_1$ and $D_2$ are substantially stabilized, and also the direct currents of the transistors $Q_9$ and $Q_{10}$ of the initial-stage amplifier circuit 41 are substantially stabilized. Thus, the amplifier circuit 4 operates stably.

Therefore, when the supply voltage $+V_{CC}$ repeats a rise and fall in level with the boundary at the Zener voltage $V_{ZD1}$ of the Zener diode $ZD_1$ in a short time, the circuit operation of the amplifier in FIG. 7 becomes very unstable.

In contrast, in the embodiment of FIG. 6, the stability against the rise and fall of the supply voltage $+V_{CC}$ in a short time is enhanced for reasons described below.

In the supply voltage detector 5′ of FIG. 6, when the following condition is met in the case of the rise of the supply voltage $+V_{CC}$, the transistor $Q_1$ turns from the "on" state to the "off" state and the transistor $Q_2$ from the "off" state to the "on" state as in the embodiment of FIG. 2:

$$V_{CC} > V_{CCX} = V_{ZD1} + \frac{R_1 + R_2}{R_1} \cdot V_{BEQ2} \quad (8)$$

In the case of the rise of the supply voltage $+V_{CC}$, accordingly, the transistor $Q_1$ turns "on", the transistor $Q_2$ turns "off", the transistor $Q_3$ turns "on" and the transistor $Q_4$ turns "off" for $V_{CC} < V_{CCX}$, so that the direct current of the constant current load transistor $Q_{14}$ of the driving amplifier circuit 42 becomes null to stop the amplifying operation of the amplifier circuit 4.

On the other hand, when $V_{CC} > V_{CCX}$ has been met upon further rise in the supply voltage $+V_{CC}$, the transistor $Q_1$ turns "off", the transistor $Q_2$ turns "on" and the transistor $Q_3$ turns "off", so that the direct currents to flow through the collector-emitter paths of the transistors $Q_4$ and $Q_{15}$ are set by the direct current which flows through the resistor $R_9$ and the collector-emitter path of the transistor $Q_{16}$. Since a current proportional to the direct current of this transistor $Q_{15}$ begins to flow through the constant current load transistor $Q_{14}$, the driving amplifier circuit 42, indeed, the whole amplifier circuit 4, starts the amplifying operations.

In addition, in the supply voltage detector 5' of FIG. 6, when the following condition has been met in the case of the fall of the supply voltage $+V_{CC}$, the transistor $Q_1$ turns from the "off" state to the "on" state and the transistor $Q_2$ turns from the "on" state to the "off" state as in the embodiment of FIG. 2:

$$V_{CC} < V_{CCY} = V_{ZD1} + V_{BEQ2} \quad (9)$$

In the case of the fall of the supply voltage $+V_{CC}$, accordingly, the transistor $Q_1$ is held in the "off" state, the transistor $Q_2$ is held in the "on" state and the transistor $Q_3$ is held in the "off" state for $V_{CC} > V_{CCY}$. The direct current therefore continues to flow through the constant current load transistor $Q_{14}$, so that the driving amplifier circuit 42, indeed, the whole amplifier circuit 4, continues the amplifying operations.

On the other hand, when $V_{CC} < V_{CCY}$ has been met upon further fall of the supply voltage $+V_{CC}$, the transistor $Q_1$ turns "on", the transistor $Q_2$ turns "off", the transistor $Q_3$ turns "on" and the transistor $Q_4$ turns "off". The direct current of the constant current load transistor $Q_{14}$ accordingly becomes null, so that the driving amplifier circuit 42 and the whole amplifier circuit 4 stops the amplifying operations.

In this manner, the supply voltage detector 5 in FIG. 2 and the supply voltage detector 5' in FIG. 6 have hysteresis characteristics as stated above, which bring forth an advantage described hereunder. When the relationship between the resistances $R_1$ and $R_2$ is selected to be $R_2 > R_1$, the first threshold voltage $V_{CCX}$ is set at a value sufficiently higher than the Zener voltage $V_{ZD1}$, as indicated by expressions (4) and (8), while the second threshold voltage $V_{CCY}$ is set at a value somewhat higher than the Zener voltage $V_{ZD1}$ as indicated by expressions (5) and (9). In the embodiments of FIGS. 2 and 6, when the supply voltage $+V_{CC}$ rises, the amplifying operation of the amplifier circuit 4 is started under the condition of $V_{CC} > V_{CCX}$ for the first time. The amplifying operation of the amplifier circuit 4 is not stopped even when, after the starting thereof, $V_{CC} < V_{CCX}$ has been established due to the fall of the supply voltage $+V_{CC}$, but it is stopped for the first time when $V_{CC} < V_{CCY}$ has been established due to a further fall of the supply voltage $+V_{CC}$. Accordingly, the disadvantage of the amplifier in FIG. 7 (that is, the instability of the operation in the case of the rise and fall of the supply voltage $+V_{CC}$ with the boundary at the Zener voltage $V_{ZD1}$) is eliminated by the present invention.

The present invention thus far described can have various modifications within the scope of the fundamental technical idea thereof. The circuit arrangement of the amplifier circuit 4 (for example, the circuit arrangements of the initial-stage amplifier circuit 41, the driving amplifier circuit 42 and the push-pull output circuit 43) can be variously modified. The Zener diode $ZD_1$ can be replaced with another voltage regulator means (for example, a plurality of forward PN-junctions connected in series, a well-known constant voltage circuit utilizing the base-emitter forward voltage of a transistor, or the like).

Meanwhile, the voltage level of a car battery, which serves as the power source of an audio amplifier installed in an automobile, often fluctuates for a moment or over a long time during the starting operation of a car or during the ignition or wiper operation while the automobile is running. Even in a general-purpose audio amplifier, when the on-off operations of a power switch are repeated, a supply voltage exhibits very abrupt changes.

It can be readily understood that the present invention demonstrates remarkable effects when utilized in these applications.

While we have shown and described several embodiments in accordance with the present invention, it is understood that the same is not limited thereto but is susceptible of numeraous changes and modifications as known to a person skilled in the art, and we therefore do not wish to be limited to the details shown and decribed herein but intend to cover all such changes and modifications as are obvious to one of ordinary skill in the art.

What is claimed is:

1. An amplifier comprising:
   (a) an amplifier circuit including means for amplifying an input signal while a power supply voltage is applied thereto from a power supply voltage terminal;
   (b) power supply voltage detector means connected to said power supply voltage terminal and having a hysteresis detecting characteristic as to a first threshold level and a second threshold level, wherein said first threshold level is at a higher level than said second threshold level; and
   (c) means connected to said power supply voltage detector means and said amplifier circuit for controlling said amplifying means to amplify said input signal, wherein the amplifying operation of said amplifying means is started by said control means when said power supply voltage becomes higher than said first threshold level during a rise of said power supply voltage, and wherein said amplifying operation of said amplifying means is stopped by said control means when said power supply voltage becomes lower than said second threshold level during a fall of said power supply voltage.

2. An amplifier according to claim 1, wherein said power supply voltage detector means includes voltage regulator means connected to said power supply voltage terminal and said amplifier circuit for applying a constant voltage to said amplifier cirucit as a stabilized operating voltage and for setting said first and second threshold levels.

3. An amplifier according to claim 2, wherein both of said first and second threshold levels are higher than the level of the constant voltage of said voltage regulator means.

4. An amplifier according to claim 1, further comprising a smoothing circuit for connecting said power supply voltage terminal to a source of supply voltage.

5. An amplifier according to claim 1, further comprising an audio speaker connected to said amplifying means to be driven by an output signal of said amplifier circuit.

6. An amplifier comprising:
   (a) an amplifier circuit including means for amplifying an input signal while a power supply voltage is applied thereto from a power supply voltage terminal; and
   (b) power supply voltage detector means connected to said power supply voltage terminal for controlling the operation of said amplifying means and having a hysteresis detecting characteristic as to a first threshold level and a second threshold level, wherein said first threshold level is higher than said second threshold level, wherein the amplifying operation of said input signal by said amplifying means is started by the output of said detector means when said power supply voltage exceeds said first threshold level as said power supply voltage is increasing, and wherein said amplifying operation of said input signal by said amplifying means is stopped by the output of said detector means when said power supply voltage becomes less than said second threshold level as said power supply voltage is falling.

7. An amplifier according to claim 6, wherein said detector means includes voltage regulator means connected to said power supply terminal and said amplifier circuit for applying a constant voltage to said amplifier circuit as a stabilized operating voltage and for setting said first and second threshold levels.

8. An amplifier according to claim 7, wherein said detector means further includes a first transistor and a first resistor connected in series with said voltage regulator means to ground, a second transistor connected in series with a second resistor between said power supply voltage terminal and ground, the base of said first transistor being connected to the collector of said second transistor and the base of said second transistor being connected to the point of connection of said first transistor and said voltage regulator means.

9. An amplifier according to claim 8, wherein said voltage regulator means comprises a Zener diode connected in series with a third resistor to said power supply voltage terminal.

10. An amplifier according to claim 9, wherein the resistance value of said third resistor is greater than that of said first resistor.

11. An amplifier according to claim 8, wherein said voltage regulator means comprises a Zener diode.

12. An amplifier according to claim 8, wherein said detector means further includes a third transistor connected in series with at least one diode between said second resistor and said power supply voltage terminal and means for connecting the base of said third transistor to said voltage regulator means, and means for connecting the emitter of said third transistor to said amplifier circuit to supply a stabilized operating voltage thereto.

13. An amplifier according to claim 6, further comprising a smoothing circuit for connecting said power supply voltage terminal to a source of supply voltage.

14. An amplifier according to claim 6, further comprising an audio speaker connected to said amplifying means to be driven by an output signal of said amplifier circuit.

* * * * *